(12) United States Patent
Morvan et al.

(10) Patent No.: US 12,453,113 B2
(45) Date of Patent: Oct. 21, 2025

(54) HIGH ELECTRON MOBILITY TRANSISTOR WITH REDUCED ACCESS RESISTANCE AND METHOD FOR MANUFACTURING A HIGH ELECTRON MOBILITY TRANSISTOR WITH REDUCED ACCESS RESISTANCE

(71) Applicants: COMMISSARIAT À L'ENERGIE ATOMIQUE ET AUX ENERGIES ALTERNATIVES, Paris (FR); THALES, Courbevoie (FR)

(72) Inventors: Erwan Morvan, Grenoble (FR); Jérôme Biscarrat, Grenoble (FR); Yveline Gobil, Grenoble (FR)

(73) Assignees: COMMISSARIAT À L'ENERGIE ATOMIQUE ET AUX ENERGIES ALTERNATIVES, Paris (FR); THALES, Courbevoie (FR)

(*) Notice: Subject to any disclaimer, the term of this patent is extended or adjusted under 35 U.S.C. 154(b) by 629 days.

(21) Appl. No.: 17/861,751

(22) Filed: Jul. 11, 2022

(65) Prior Publication Data
US 2023/0011499 A1    Jan. 12, 2023

(30) Foreign Application Priority Data
Jul. 12, 2021 (FR) ..................................... 2107551

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/221* (2025.01);
(Continued)

(58) Field of Classification Search
CPC .. H10D 30/475; H10D 30/015; H10D 62/221; H10D 62/824; H10D 62/8503;
(Continued)

(56) References Cited

U.S. PATENT DOCUMENTS 9,954,090 B1 * 4/2018 Brown ................ H01L 21/0254
10,784,338 B2 * 9/2020 Cheng ................ H10D 30/0297
(Continued)

OTHER PUBLICATIONS

Search Report as issued in French Patent Application No. 2107551, dated Mar. 4, 2022.
(Continued)

*Primary Examiner* — Tan N Tran
(74) *Attorney, Agent, or Firm* — Pillsbury Winthrop Shaw Pittman LLP

(57) ABSTRACT

A high electron mobility transistor includes a stack of layers including a passivation layer and a heterojunction including a first semiconductor layer, a second semiconductor layer and a two-dimensional electron gas at the interface thereof, one surface of the passivation layer being in contact with the first semiconductor layer; a source metal contact and/or a drain metal contact and a gate electrode; an n+ doped zone situated inside the heterojunction; the source metal contact and/or the drain metal contact being positioned at the level of a recess formed in the stack of layers, the source metal contact and/or said drain metal contact having a thickness defined by an upper face and a lower face substantially parallel to the plane of the layers, the upper face being planar, the lower face being in contact with the n+ doped zone and below the interface between the first and second semiconductor layers.

7 Claims, 12 Drawing Sheets

(51) Int. Cl.
  *H10D 62/17*   (2025.01)
  *H10D 62/824*  (2025.01)
  *H10D 62/85*   (2025.01)
  *H10D 64/23*   (2025.01)

(52) U.S. Cl.
  CPC ....... *H10D 62/824* (2025.01); *H10D 62/8503* (2025.01); *H10D 64/251* (2025.01)

(58) Field of Classification Search
  CPC .. H10D 64/251; H10D 64/256; H10D 64/411; H10D 62/149; H01L 21/28587; H01L 21/26546
  See application file for complete search history.

(56) References Cited

U.S. PATENT DOCUMENTS

| | | |
|---|---|---|
| 2013/0299842 A1 | 11/2013 | Prechtl et al. |
| 2015/0115325 A1 | 4/2015 | Vielemeyer |
| 2020/0373421 A1 | 11/2020 | Nidhi et al. |

OTHER PUBLICATIONS

Parvais, B., et al., "GaN-on-Si mm-wave RF Devices Integrated in a 200mm CMOS Compatible 3-Level Cu Beol," IEEE, (Year: 2020), 4 pages.

Shinohara, K., et al., "Scaling of GaN HEMTs and Schottky Diodes for Submillimeter-Wave MMIC Applications," IEEE Transactions on Electron Devices, vol. 60, No. 10, Oct. 2013, pp. 2982-2996.

\* cited by examiner

HIGH ELECTRON MOBILITY TRANSISTOR WITH REDUCED ACCESS RESISTANCE AND METHOD FOR MANUFACTURING A HIGH ELECTRON MOBILITY TRANSISTOR WITH REDUCED ACCESS RESISTANCE

CROSS-REFERENCE TO RELATED APPLICATIONS

This application claims priority to French Patent Application No. 2107551, filed Jul. 12, 2021, the entire content of which is incorporated herein by reference in its entirety.

FIELD

The invention belongs to the field of high electron mobility field effect transistors for high frequency applications. One subject matter of the invention is a high electron mobility transistor with reduced access resistance. Another subject matter of the invention is a method for manufacturing such a transistor.

BACKGROUND

Numerous electronic applications require devices operating at high frequency, for example above the X band having a frequency around 10 GHz. Among these devices may be cited power amplifiers, low noise amplifiers, oscillators or switches. Such devices may be used in radars, telecommunications or in on-board electronics destined for automobiles, transports, aeronautics or medical or home automation applications.

High frequency electronic devices often resort to high electron mobility field effect transistors (HEMT). These transistors are also designated as heterojunction field effect transistors. A HEMT comprises a superposition of two semiconductor layers having different gap energies. Such a superposition leads to the formation of a quantum well at the interface between the two layers. The quantum well confines the electrons to form a two-dimensional electron gas (2 DEG). For example, the layer with higher gap energy or barrier layer may be made of AlGaN. The layer with lower gap energy or channel layer may be made of GaN.

FIG. 1 shows a schematic sectional view of a HEMT according to the prior art. The HEMT includes a heterojunction comprising a first semiconductor layer or barrier layer made of AlGaN and a second semiconductor layer or channel layer made of GaN and a passivation layer P above the barrier layer. A two-dimensional electron gas 2 DEG is formed at the AlGAN/GaN interface. The transistor of FIG. 1 further comprises a source contact S, a drain contact D and a gate electrode G. The gas 2 DEG is electrically connected to the source S and drain D contacts. The gate electrode G has a T shape, with the gate foot in the vicinity of the barrier layer made of AlGaN. The gate foot is in direct contact with the barrier in the case of a Schottky type gate or with a very thin dielectric between the gate electrode and the barrier in the case of a Metal/Insulator/Semiconductor (MIS) type gate.

HEMTs must have the lowest possible source resistance or access resistance $R_S$ in order to avoid degradation of the intrinsic performances of the transistor, the resistance $R_S$ being defined as the resistance between the source metal and the foot of the T shaped gate. Indeed, the source resistance degrades the intrinsic transconductance, the transition frequency and the maximum oscillation frequency of transistors.

It is important to consider that $R_S$ must be minimal both at ambient temperature and at the operating temperature of the access of the transistor. When powered, a HEMT works at a junction temperature of 175° C. to 225° C. The access zones are thus at temperatures above 100° C., for example at temperatures comprised between 100 and 150° C.

The source or access resistance is the sum of several resistances, the most important of which are:
  The resistance of the ohmic contact: $R_c(T°)$
  The resistance of the gas 2 DEG: $R_{2DEG}(T°)$ over a length Lgs separating the source metal and the gate foot. This resistance increases by a factor of around 2.2 at 150° C.

The techniques normally used to reduce the source resistance are the following:
  improving the contact resistance $R_c$;
  reducing the distance between the gate and the source Lgs; this technique is limited by the lithography, the design rules between the source contact and the gate foot and by the increase in gate-source parasitic capacitances Cpgs;
  reducing the sheet resistance of the 2 DEG, $R_{2DEG}$; this technique is not only limited by the characteristics of the heterojunction but also and especially by the fact that this resistance increases strongly with temperature due to degradation of the mobility of the electrons;
  introducing a very strongly doped layer between the contact and the 2 DEG (n+ layer).

An exemplary HEMT with a low access resistance is disclosed in the document "GaN-on-Si mm-wave RF Devices Integrated in a 200 mm CMOS Compatible 3-Level Cu BEOL" of B. Parvais et al., IEDM 2020. FIG. 2 shows a sectional view of such a device according to the prior art. In this case, the access of the HEMT is a lateral or "full recess" ohmic contact. This approach enables a direct contact between the 2 DEG and the ohmic contact metal by means of an etching of the passivation layer and the barrier. Such an etching of the passivation layer and the barrier layer is also called recess.

This technique makes it possible to obtain good ohmic contact resistance, of the order of 0.3 Ohm·mm. The ohmic contact metal of the access is produced by deposition and etching and must overflow the opening of the contact. As shown in FIG. 2, such a contact does not make it possible to bring closer sufficiently the ohmic contact to the foot of the T shaped gate, with a distance $L_{gs}$ of 0.64 μm. In addition, this approach presents a technological difficulty with regard to the etching of the ohmic metal. Indeed, the excessive overflow of the ohmic metal of the contact leads to a gate-source parasitic capacitance $C_{pgs}$. This leads to an important degradation of the transition frequency, with a reduction of around 25%. This prevents the use of this device in the millimetric domain or at high frequency.

Furthermore, the resistance of the 2 DEG is then of the order of 0.3 Ohm·mm at ambient temperature and greater than 0.6 Ohm·mm at the operating temperature, which greatly penalises the source access resistance during use of the device.

This technology is thus not suited to the production of a very compact source access for high frequency components.

Another example of HEMT having low access resistance is described in the document "Scaling of GaN HEMTs and Schottky Diodes for Submillimeter-Wave MMIC Applications" of Keisuke Shinohara et al., published in IEEE TRANSACTIONS ON ELECTRON DEVICES, Vol. 60, No. 10, 2013.

FIG. 3 illustrates a schematic sectional view of such a device of the prior art. In this case, the contact is produced in three steps. The AlGaN/GaN heterostructure is firstly etched, then a strongly n+ doped GaN layer is re-epitaxied locally in the etched zone. Finally, a metal contact is produced on the n+ GaN.

This type of access has very good performance but is difficult to produce because it necessitates:

- an excellent control of the etching of the barrier; the quality of the re-epitaxy of n+ GaN on the etching bottom and side is highly dependent on the morphology of the etching bottom;
- a re-introduction of the wafer into a MOCVD (metalorganic chemical vapour deposition) equipment; this is necessary for the epitaxy of III-N semiconductor material associating atoms of column III of the periodic table of elements with nitrogen N, which makes compatibility with a CMOS type clean room difficult on account of possible contaminations and increases the cost;
- a localised growth of GaN material of which the masking is difficult to carry out.

Even if this technique is very efficient, it is very difficult to integrate in a low cost industrial method and in a CMOS compatible clean room.

Those skilled in the art thus do not know HEMTs with low access resistance which are suited for high frequency applications and are simple to manufacture. In other words, there does not exist today a HEMT with very low access resistance for high frequency power (>30 GHz) components obtained by means of a low cost industrial method and realisable in a CMOS compatible clean room.

SUMMARY

An aspect of the invention aims to resolve at least partially the aforementioned problems by proposing a HEMT having a very low access resistance and a reduced source-gate and/or drain-gate parasitic capacitance, while being very compact. In addition, the HEMT according to an aspect of the invention exhibits excellent temperature behaviour, which makes it particularly well suited for high frequency power applications.

To this end, one subject matter of the invention pertains to a high electron mobility transistor comprising:

- a stack of layers comprising a passivation layer and a heterojunction comprising a first semiconductor layer, a second semiconductor layer and a two-dimensional electron gas at the interface thereof, one surface of the passivation layer being in contact with the first semiconductor layer;
- a source metal contact and/or a drain metal contact and a gate electrode;
- an n+ doped zone situated inside the heterojunction;

the source metal contact and/or the drain metal contact being positioned at the level of a recess formed in the stack of layers, the source metal contact and/or the drain metal contact having a thickness defined by an upper face and a lower face substantially parallel to the plane of the layers, the upper face being planar, the lower face being in contact with the n+ doped zone and below the interface between the first semiconductor layer and the second semiconductor layer, the source metal contact and/or the drain metal contact further having a lateral face, the n+ doped zone extending from the lateral face of the source metal contact and/or from the lateral face of the drain metal contact to the gate electrode over a length comprised between 300 and 1000 nm.

Hereafter, the invention is described with respect to the source metal contact. However, each characteristic of the source metal contact may also refer to the drain metal contact or to the two source and drain metal contacts. In other words, the transistor according to an aspect of the invention may have a very low source access resistance, a very low drain access resistance or a very low source and drain resistance. An n+ doped zone is taken to mean a region of the heterojunction n+ doped by ion implantation. An n+ doping is taken to mean a strong n doping (i.e. with a concentration of donors greater than $10^{19}$ cm$^{-3}$ and, in an embodiment, greater than $10^{20}$ cm$^{-3}$). The n+ doped zone makes it possible to reduce the extension of the two-dimensional electron gas comprised between the source metal contact and the gate electrode while moving the source metal contact away from the gate electrode. In other words, the source metal contact is set back with respect to the end of the n+ doped zone, the set back being the distance between the lateral face of the source contact the closest to the gate electrode and the end of the n+ doped zone.

Thanks to the invention, the sheet resistance of the n+ doped zone is less than the resistance of the two-dimensional electron gas and much less sensitive to temperature and the reduction of the extension of the two-dimensional electron gas makes it possible to reduce the access resistance of the source contact.

The set back of the source metal contact with respect to the gate makes it possible to reduce the parasitic capacitance between the source contact and the gate electrode, which makes the transistor according to the invention very well suited to the high frequency regime.

The electrical contact between the source metal contact and the two-dimensional electron gas is achieved thanks to the fact that the lower face of the source contact is in contact with the n+ doped zone. In other words, the source contact forms a recess or a niche extending below the interface between the first semiconductor layer or barrier layer and the second semiconductor layer or channel layer.

In a transistor according to an aspect of the invention, the contact resistance between the lower face of the source contact and the n+ doped zone is very low and very little sensitive to the operating temperature, which makes it possible to reduce the access source resistance.

Planar upper face of the metal contact is taken to mean a metal surface having a uniform thickness and a surface without deformations such as bumps or hollows. The planarity of the surface makes it possible to "plane down" the metal of the source contact and to avoid the lateral extension thereof. The planarity of the surface further makes it possible to have optimal control of the later lithography of the gate foot and thus excellent control of the lithographied shapes and the positioning thereof.

The planar upper face of the contact makes it possible to obtain a contact that is compact, thin and without overflow by reducing later the parasitic capacitances between the source contact and the gate.

In addition, it may be observed that the source access is efficient and very little sensitive to the operating temperature of the transistor according to the invention.

The transistor according to an aspect of the invention may also have one or more of the characteristics below, considered individually or according to all technically possible combinations thereof:

- the n+ doped zone is an implanted zone having a spatial doping profile of gaussian type along the direction normal to the plane of the layers;

the lower face of the source metal contact and/or the lower face of the drain metal contact is below the two-dimensional electron gas;

the lower face of the source metal contact and/or the lower face of the drain metal contact is at the level of the peak of the gaussian type spatial doping profile along the direction normal to the plane of the layers;

the distance Lgs between the gate electrode and the end of the n+ doped zone is comprised between 200 nm and 400 nm;

the n+ doped zone is doped with an Si or Ge type dopant with a concentration greater than or equal to $10^{20}$ cm$^{-3}$, the first semiconductor layer comprises AlGaN and the second semiconductor layer comprises GaN;

the first semiconductor layer comprises a material chosen from the group comprising: AlGaN, AlN, InGaAlN, ScAlN;

the first semiconductor layer is a bilayer chosen from the group of bilayers comprising: AlGaN/AlN, AlGaN/GaN, InAlN/AlN, InGaAlN/AlN, or ScAlN/AlN.

the second semiconductor layer is made of GaN or AlGaN, the transistor further comprises a drain contact having the same structure as the source contact.

Another subject matter of the invention is a method for manufacturing a high electron mobility transistor comprising the following steps:

provision of a high electron mobility transistor substrate comprising a stack of layers comprising a passivation layer and a heterojunction comprising a first semiconductor layer, a second semiconductor layer and a two-dimensional electron gas at the interface thereof;

formation of an n+ doped zone by ion implantation inside the heterojunction and activation annealing of the n+ doped zone;

deposition of a dielectric layer in contact with the passivation layer;

etching of the stack of layers and the dielectric layer to form a recess directly in line and in contact with the n+ doped zone, the recess being suited to accommodate a source and/or drain metal contact, the lower face of the recess being situated below the interface between the first semiconductor layer and the second semiconductor layer;

deposition of a metal layer intended to form the source metal contact and/or the drain metal contact;

chemical mechanical polishing of the metal layer to obtain a planarized upper surface of the source contact and/or upper surface of the drain contact;

definition and deposition of a gate electrode, the n+ doped zone extending from a lateral face of the source metal contact and/or from a lateral face of the drain metal contact to the gate electrode over a length comprised between 300 and 1000 nm.

The method according to the invention makes it possible to obtain an n+ doped zone ensuring a very efficient electrical contact which reduces the access resistance of the transistor.

The method according to the invention is reliable, precise, uniform, reproducible and realisable in a CMOS compatible clean room.

An exemplary high electron mobility transistor substrate used in the method according to the invention comprises a Si <111> substrate with high resistivity, a nucleation layer made of AlN, a stress management layer, a buffer layer made of GaN or AlGaN with low Al content, a confinement barrier layer, a channel layer made of GaN and a barrier layer made of AlGaN.

The method according to the invention may also comprise one or more of the steps below, considered individually or according to all technically possible combinations thereof:

the step of formation of the n+ doped zone comprises a mono-energy implantation of Si or Ge ions, with an implantation energy comprised between 60 keV and 80 keV (for Si);

the activation annealing of the n+ doped zone comprises a heat treatment at 975° C. for 10 h, at 1000° C. for three hours or at 1050° C. for one hour;

the method further comprises a photolithography step to define an implantation zone intended to accommodate the n+ doped zone;

the mono-energy implantation of Si or Ge ions comprises the creation of an n+ doped zone having a gaussian type spatial doping profile along the direction normal to the plane of the layers. The use of implantations with several energies does not make it possible to attain the targeted performance;

the implantation step is only carried out for the source contact;

the implantation step is carried out once for the source contact and for the drain contact.

BRIEF DESCRIPTION OF THE FIGURES

Other characteristics and benefits of the invention will become clear from the description that is given thereof below, as an indication and in no way limiting, with reference to the appended figures, among which.

DETAILED DESCRIPTION

Figure 1:
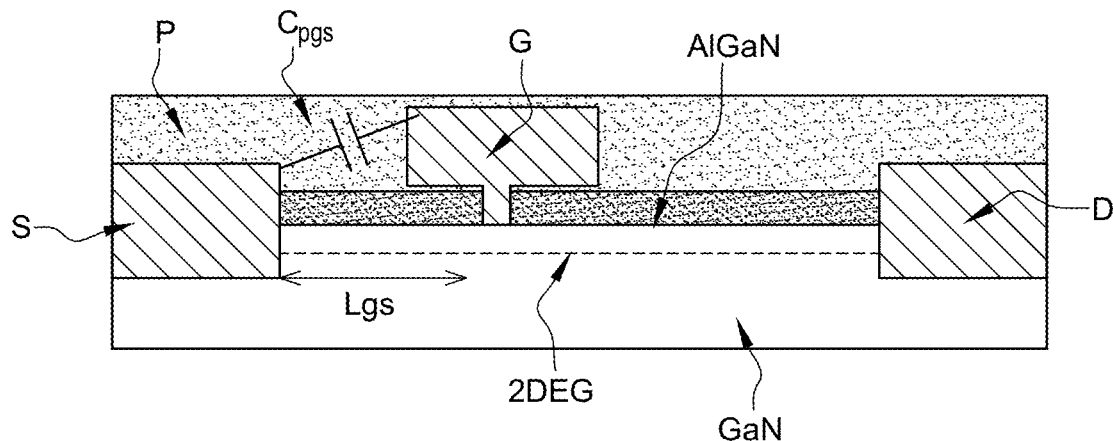
FIG. 1 illustrates a schematic sectional view of a HEMT according to the prior art.
Figure 2:
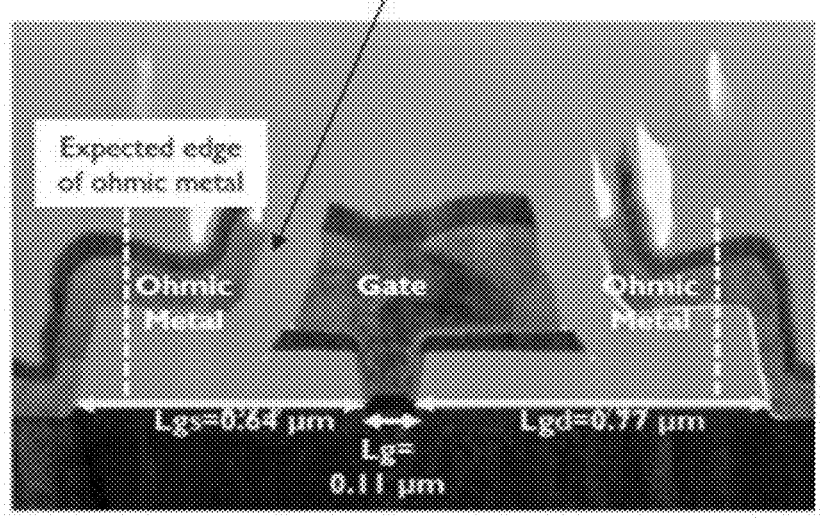
FIG. 2 represents a TEM image of a HEMT according to the prior art and comprising a "full-recess" type contact with overflowing metal.
Figure 3:
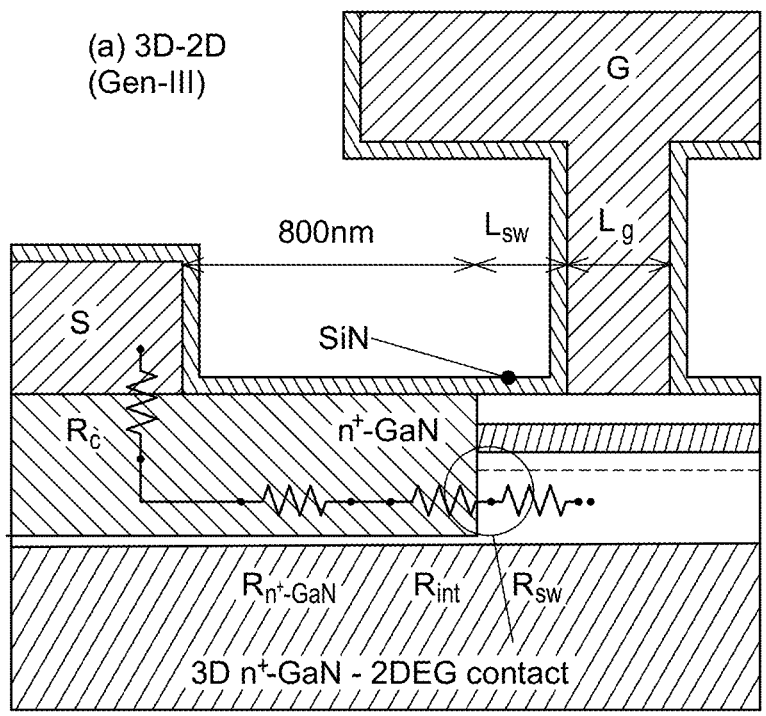
FIG. 3 represents a schematic sectional view of a HEMT according to the prior art and comprising a source or drain contact produced by etching and re-epitaxy.

FIG. 3 represents a schematic sectional view of a high electron mobility transistor 400 according to an aspect of the invention. In particular, FIG. 3 represents the part of the transistor 400 comprising a source contact 405 and a gate electrode 406. The transistor 400 according to an aspect of the invention comprises a stack of layers comprising a passivation layer 401 and a heterojunction comprising a first semiconductor layer 402 and a second semiconductor layer 403.

The first semiconductor layer 402 has a gap energy higher than the second semiconductor layer 403. The first semiconductor layer 402 is also called barrier layer or barrier. The second semiconductor layer 403 is also called channel layer or channel. A two-dimensional electron gas or 2 DEG 404 is formed at the interface between the barrier layer 402 and the channel layer 403. The passivation layer 401 is in contact with the first semiconductor layer 402.

According to an embodiment, the passivation layer 401 is a bilayer comprising the layers 401a and 401b. According to an embodiment, the layers 401a and 401b are made respectively of $SiO_2$ and SiN.

Figure 4:
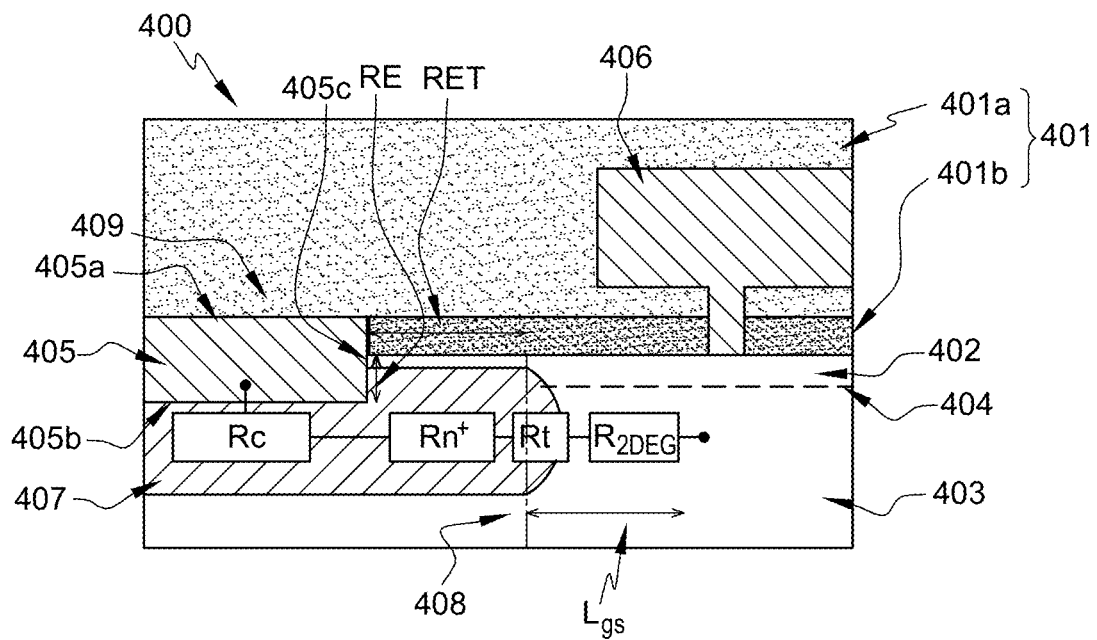
FIG. 4 represents a schematic sectional view of a part of a HEMT according to the invention.

The transistor 400 according to an aspect of the invention further comprises the source metal contact 405, a drain metal contact not represented and the gate electrode 406. FIG. 4 represents only the source contact. The gate electrode 406 is positioned between the source and drain metal contacts. According to an embodiment, the gate electrode 406 may have a T shape, with a gate foot in the vicinity of the barrier layer 402.

In other words, FIG. 4 represents half of the structure of the transistor 400 according to an aspect of the invention, the drain contact not being represented. According to an embodiment of the invention, the transistor 400 is symmetrical with a drain contact identical to the source contact. The gate-drain distance is greater than or equal to the gate-source distance.

The transistor 400 according to an aspect of the invention further comprises an n+ doped zone 407 being situated inside the heterojunction. In other words, one end 408 of the n+ doped zone 407 is positioned between the source 405 or drain metal contact and the gate foot.

The n+ doped zone 407 is obtained by ion implantation of an n type dopant.

According to the embodiment represented in FIG. 4, the barrier layer 402 is made of AlGaN, the channel layer 403 is made of GaN and the n+ doped zone 407 is obtained thanks to a local implantation of silicon with gaussian profile. The ion implantation is associated with an optimised activation annealing, at 975° C. for 10 h, at 1000° C. for 3 hours or at 1050° C. for one hour, to form a n+ doped zone and an efficient contact.

According to an embodiment, the heterojunction is a III-N type heterostructure based on Al, In or Ga. Examples of such heterostructures are AlGaN/AlN/GaN, AlGaN/GaN, InGaAlN/AlN/GaN, or AlGaN/AlN/AlGaN in which the channel is made of AlGaN.

According to an embodiment, the heterojunction is a III-N type heterostructure based on ScAlN. Examples of such heterostructures are ScAlN/GaN or ScAlN/AlN/GaN.

The source or drain metal contact 405 is situated at the level of a recess 409 formed in the stack of layers. The metal contact 405 has a thickness defined by an upper face 405a of the metal contact and a lower face 405b of the metal contact. The two upper and lower faces of the metal contact 405 are substantially parallel to the planes of the layers.

The upper face 405a is planar so as to reduce parasitic capacitances between the gate electrode 406 and the source or drain metal contact 405. In other words, the thickness of the source or drain contact 405 is constant over the whole region of the contact 406. In an equivalent manner, the thickness of the contact 405 is equal to the thickness of the recess.

The arrangement of the upper face 405a of the metal contact 405 makes it possible to produce a contact that is very compact, thin and without overflow and thus to reduce to the maximum parasitic capacitances $C_{pgs}$ between the metal of the contact 405 and the gate metal. The planarization also makes it possible to improve the control of following lithographies.

The lower face 405b is in contact with the n+ doped implanted zone 407. In other words, the metal contact 405 forms a recess RE with respect to the surface of the barrier layer 402 and the lower face 405b of the contact 405 is below the interface between the first semiconductor layer 402 and the second semiconductor layer 403.

The recess RE under the barrier layer 402 makes it possible to reduce the metal/semiconductor layer contact resistance $R_c$ to very low values of the order of 50-70 mOhm·mm. This is possible by positioning the ohmic metal on the n+ doped channel zone 407 and not on the barrier layer 402 which has a larger gap. The minimum depth of the recess RE is such that the ohmic metal is deposited on the surface of the n+ doped zone 407 or at the maximum at the depth of the peak of the implantation profile of the n+ doped zone 407.

The contact 405 further comprises a lateral face 405c substantially normal to the plane of the layers. The distance RET between the lateral face 405c and the end 408 of the n+ doped zone 407 is comprised between 300 nm and 1000 nm. In other words, the metal contact 405 is set back with respect to the end 408 of the n+ doped zone 407.

The sheet resistance $R_{sheet}$ associated with the n+ implanted zone 407 is very low and less than 60-90 ohm/sq. This makes it possible to move the metal contact 405 away from the gate electrode 406 without substantially increasing the access resistance. In particular, the n+ layer is at least three times more efficient than the 2 DEG at ambient temperature and five times more efficient at 100° C. The set back RET is sufficiently large to limit parasitic capacitance $C_{pgs}$ and sufficiently small to avoid increasing the resistance of the n+ layer.

According to an embodiment, the distance RET is comprised between 300 nm and 1000 nm. The distance RET is here equal to 500 nm.

The transition resistance $R_t$ between the implanted region and the intrinsic region is low thanks to an optimised ion implantation of Si.

According to an embodiment, the implantation is monoenergetic of 70 kV/3-5*$10^{15}$/$cm^2$ through a 30 nm surface layer. The use of a multi-energy implantation, normal in wide gap semiconductors, would not give similar results because it would lead to a high resistance $R_t$.

The distance $L_{gs}$ between the end 408 of the n+ doped zone 407 and the gate foot is sufficiently large so as not to degrade the voltage withstand of the gate-source or gate-drain junction. According to an embodiment, $L_{gs}$ is greater than or equal to 200 nm.

The Si implantation has a lateral dispersion which does not come too close to the gate foot. $L_{gs}$ is sufficiently small to limit the contribution of the gas 2 DEG to $R_s$, for example $L_{gs}$ is less than 400 nm. According to an embodiment, $L_{gs}$ is equal to 300 nm.

According to an embodiment, the metal contact 405 comprises a Ti/Al bilayer with a thickness of the Ti layer comprised between 3 nm and 20 nm and a total thickness equal to 200 nm+/−50 nm.

FIG. 4 also represents the distribution of the source or drain access resistances: the contact resistance $R_c$, the resistance of the n+ implanted region $R_{n+}$, the transition resistance $R_T$ and the resistance of the two-dimensional electron gas 2 DEG, $R_{2DEG}$.

The access resistance $R_s$ of a source contact of the transistor 400 according to the invention is equal at ambient temperature, T=30° C., to:

$$R_s = R_c + R_{n+} + R_t + R_{2DEG} = 0.3 \text{ Ohm·mm};$$

At $T=150°$ C.: $R_s = R_c + R_{n+} + R_t + R_{2DEG} = 0.35$ Ohm·mm

Figure 5:
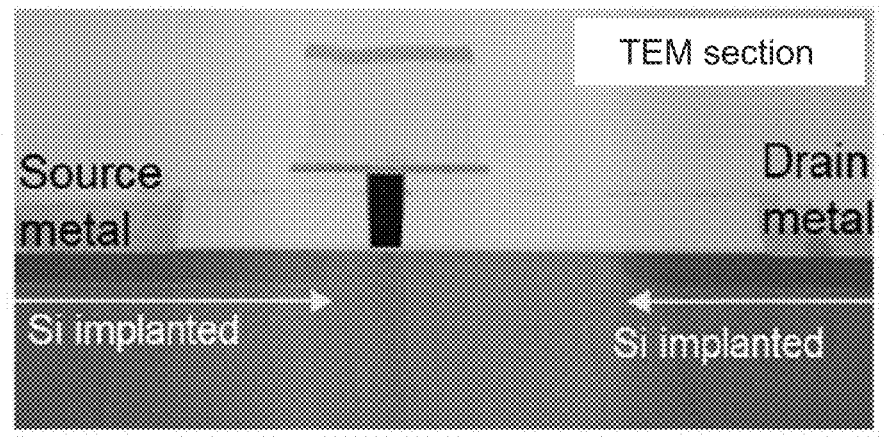
FIG. 5 represents a TEM section of a transistor according to the invention.

It may be observed that the access of a transistor 400 according to an aspect of the invention is efficient and very little sensitive to temperature thanks:

to the small length $L_{gs}$ realisable, of the order of 300 nm;
to the compensation of $R_{2DEG}(T°)$ by $R_t(T°)$ The transistor 400 according to an aspect of the invention is obtained by a planar method compatible with manufacture in a CMOS type clean room. The FIG. 5 represents a TEM section of a transistor 400 according to an aspect of the invention. The source contact and the drain contact are both visible in FIG. 5.

Figure 6:
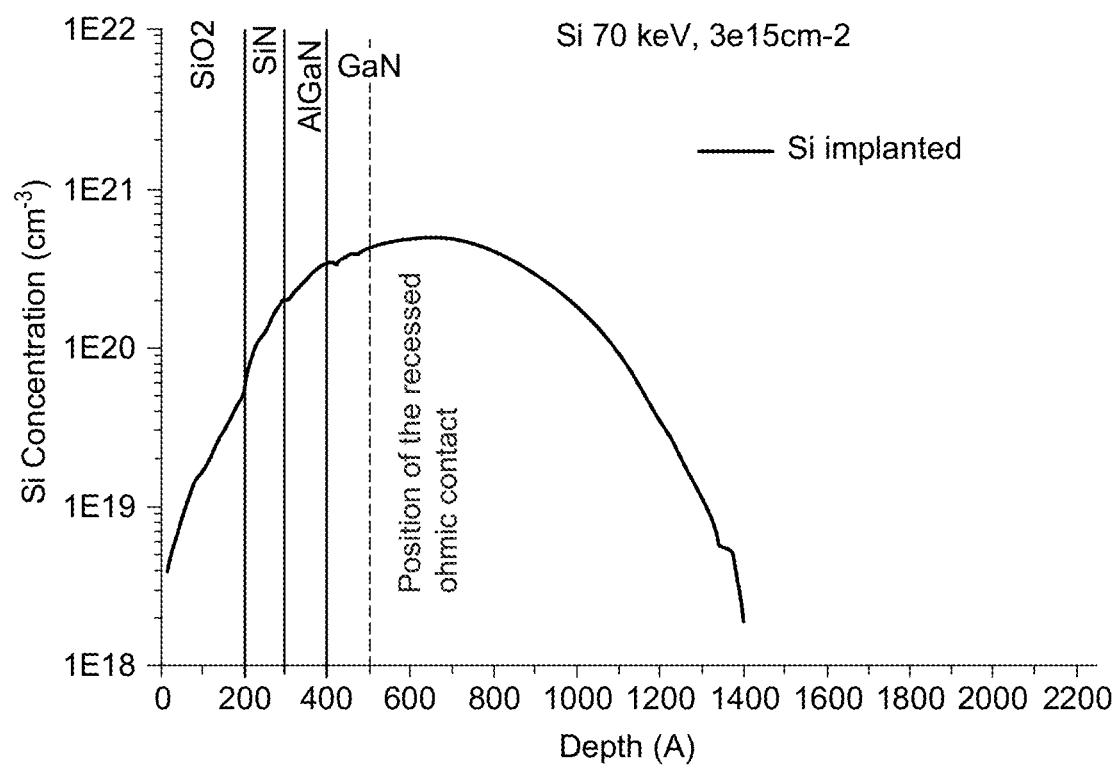
FIG. 6 represents the implantation profile of Si ions according to one embodiment of the transistor according to the invention.

FIG. 6 represents the Si implantation profile as a function of the depth along a direction normal to the plane of the layers. The implantation profile has been obtained for an energy of 70 keV and a dose of $3*10^{15}/cm^2$ through the surface passivation layer 401 formed by a SiO$_2$/SiN bilayer. The position of the interface of the n+ ohmic contact metal/GaN is represented by the dotted line. The profile has a projected range Rp of 64.5 nm, a sigma dispersion of 23 nm and a lateral extension of 40 nm. The lateral extension represents the lateral overflow of the profile under the mask.

Figure 7:
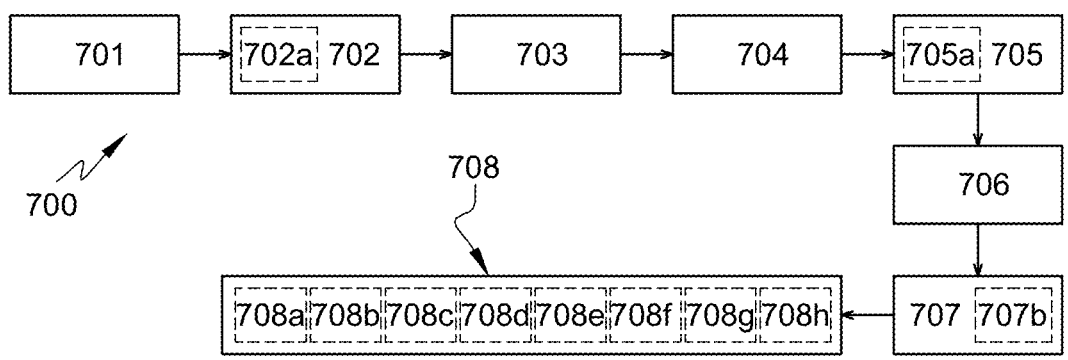
FIG. 7 schematically illustrates the method according to the invention.

FIG. 7 schematically represents the method 700 according to an aspect of the invention. The steps of the method 700 according to an aspect of the invention are illustrated in FIGS. 8a to 8p.

The method 700 according to an aspect of the invention comprises a step 701 of provision of a high electron mobility transistor substrate comprising a stack of layers comprising a passivation layer and a heterojunction comprising a first semiconductor layer and a second semiconductor layer forming a two-dimensional electron gas at the interface thereof. An exemplary high electron mobility transistor substrate used during step 701 is illustrated in FIG. 8a. According to an embodiment, the high electron mobility transistor substrate comprises a Si <111> substrate with high resistivity, a nucleation layer made of AlN, a stress management layer, a buffer layer made of GaN or AlGaN with low Al content, a confinement barrier layer, a channel layer made of GaN and a barrier layer made of AlGaN. According to another embodiment, the high electron mobility transistor substrate comprises a substrate made of Sic or GaN instead of the substrate made of Si. In the case of a GaN substrate, the epitaxy is carried out initially on a GaN wafer.

Figure 8A:
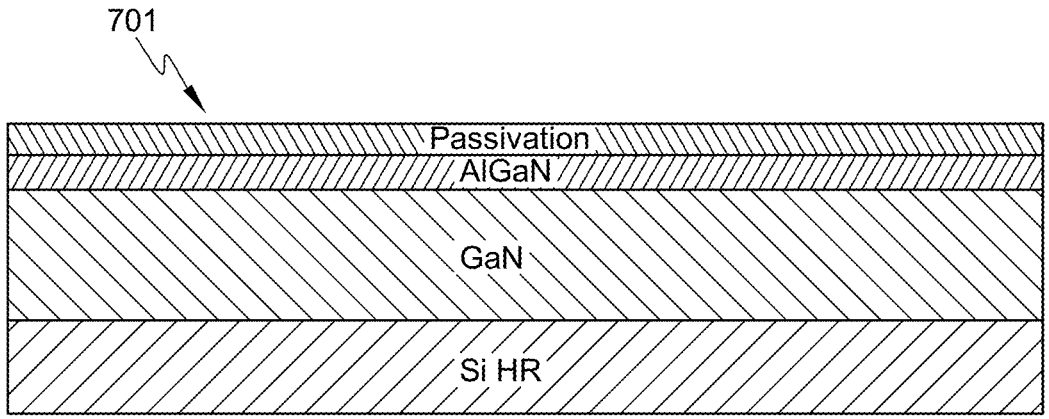
FIGS. 8a to 8p illustrate the results of the different steps of the method according to the invention of FIG. 7.

In the case of FIG. 8a, the first semiconductor layer is made of AlGaN and the second semiconductor layer is made of GaN. The stack of FIG. 8a further comprises a substrate made of high resistance (HR) Si.

Figure 8B:
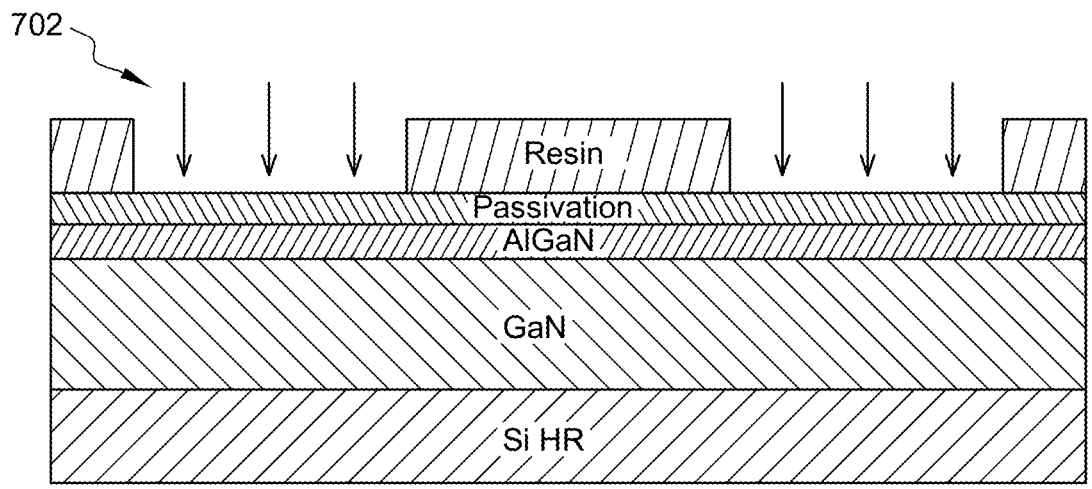

Step 702 comprises the ion implantation of an n type dopant, illustrated in FIG. 8b. In the example illustrated in FIG. 8b, the implantation is carried out symmetrically in two different zones corresponding to the source contact and to the drain contact.

According to an embodiment, the ion implantation step 702 is preceded by a photolithography step 702a for the definition of an implantation zone. The photolithography step is known to those skilled in the art.

According to an embodiment, the dopant is silicon or germanium.

According to an embodiment, step 702 comprises a mono-energy implantation of Si ions of $70 \text{ kV}/3\text{-}5*10^{15}/cm^2$ through a 30 nm surface layer. An implantation profile according to the invention is described in FIG. 6. The use of a multi-energy implantation, normal in large gap semiconductors for generating doped wells, is not the most suitable because it leads to a high transition resistance $R_t$.

The method 700 further comprises a step 703 of annealing of the dopant. According to one embodiment, the dopant is Si and the annealing may be carried out at 975° C. for 10 hours, at 1000° C. for three hours or at 1050° C. for one hour.

A long annealing at low temperature makes it possible to avoid the plastic deformation of the GaN/Si wafers.

Si is an n+ dopant very suited to the production of a localised n+ doped zone:

It is activable at low temperature in III-N compounds such as AlN, AlGaN or GaN;
It has a solubility greater than $4*10^{20}/cm^3$ enabling very high doping, for example greater than $10^{20}/cm^3$, and negligible diffusion;
It is an element compatible with CMOS and planar technologies.

Figure 8C:
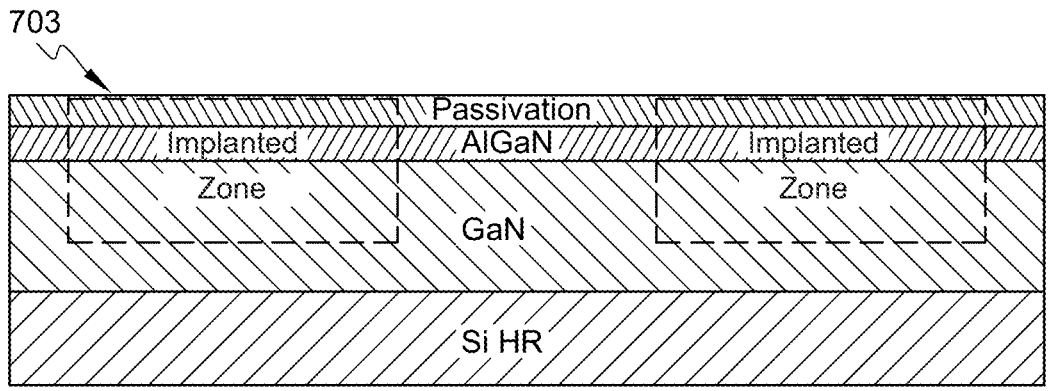

According to an embodiment, the annealing step 703 is preceded by the removal of the resin used for the lithography step. Step 703 of removal of the resin and annealing of the dopant is illustrated in FIG. 8c.

Figure 8D:
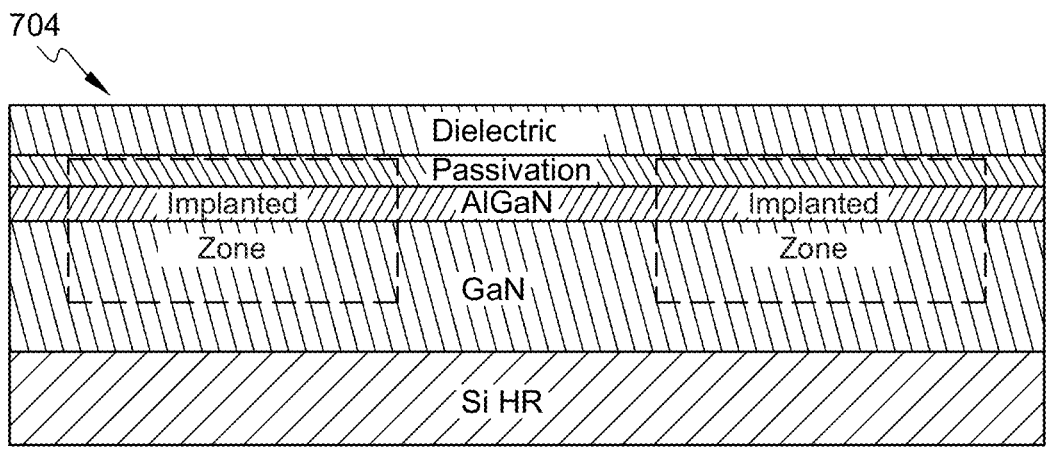

The method 700 according to an embodiment of the invention further comprises a step 704 of deposition of a dielectric layer in contact with the passivation layer. Step 704 of deposition of a dielectric layer is illustrated in FIG. 8d.

The method 700 comprises a step of etching 705 of the stack of layers and the dielectric layer to form a recess directly in line and in contact with the implanted zone, the recess being intended to accommodate a source or drain metal contact, the distance separating one end of the implanted zone and a lateral wall of the recess being comprised between 300 nm and 1000 nm, the lower face of the recess being situated below the interface between the first and the second semiconductor layer. According to an embodiment, the etching step 705 comprises a photolithography step 705a to define the region to etch.

Figure 8E:
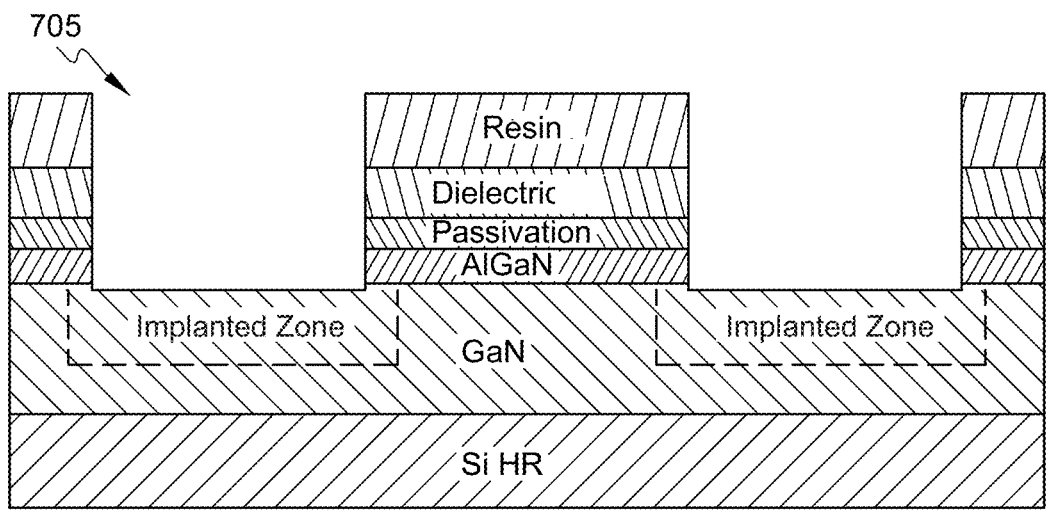

The step 705 of photolithography and etching of the stack is illustrated in FIG. 8e.

According to an embodiment, the etching carried out during step 705 is a dry etching.

Figure 8F:
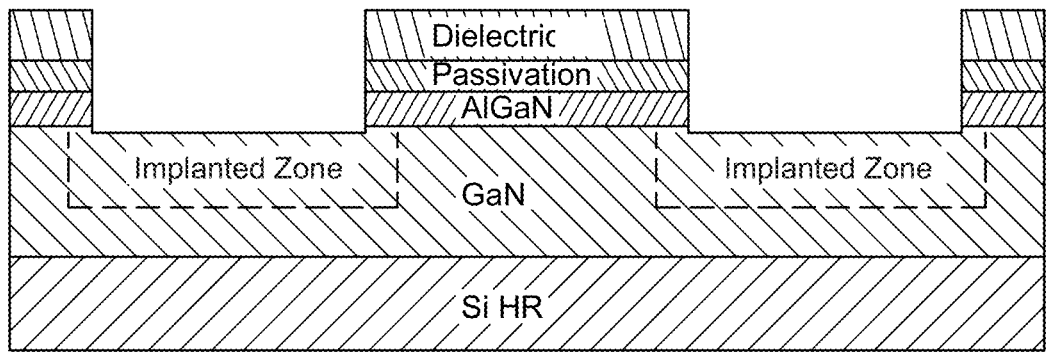

According to an embodiment, the etching step 705 also comprises the removal of the resin used during the photolithography sub-step. The stack of layers obtained after the removal of the resin is illustrated in FIG. 8f.

The method 700 according to an aspect of the invention further comprises a step 706 of deposition of a metal layer intended to form the source or drain contact followed by a step 707 of chemical mechanical polishing of the metal layer to obtain a planarized upper surface of the source or drain metal contact.

Figure 8G:
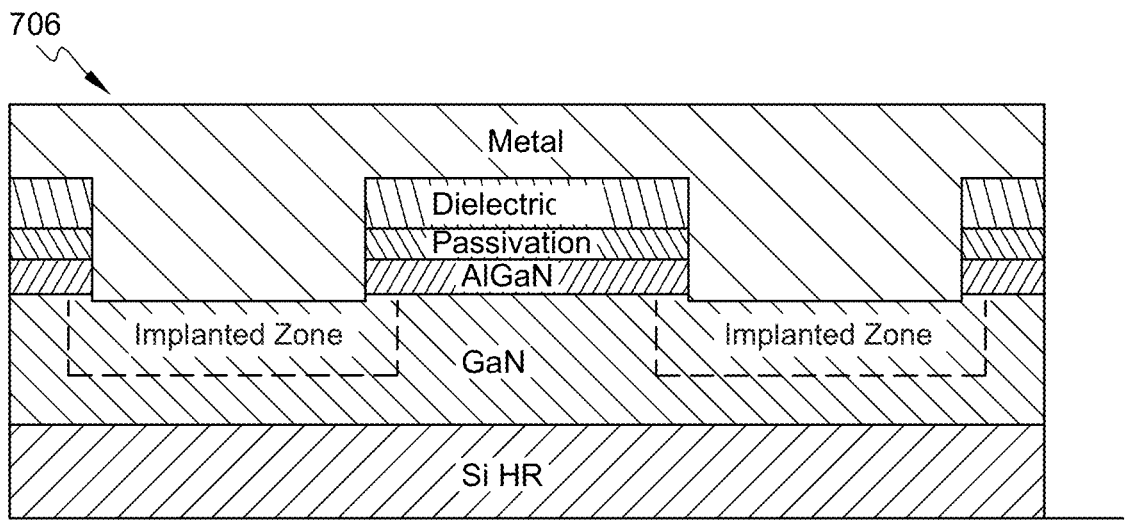
Figure 8H:
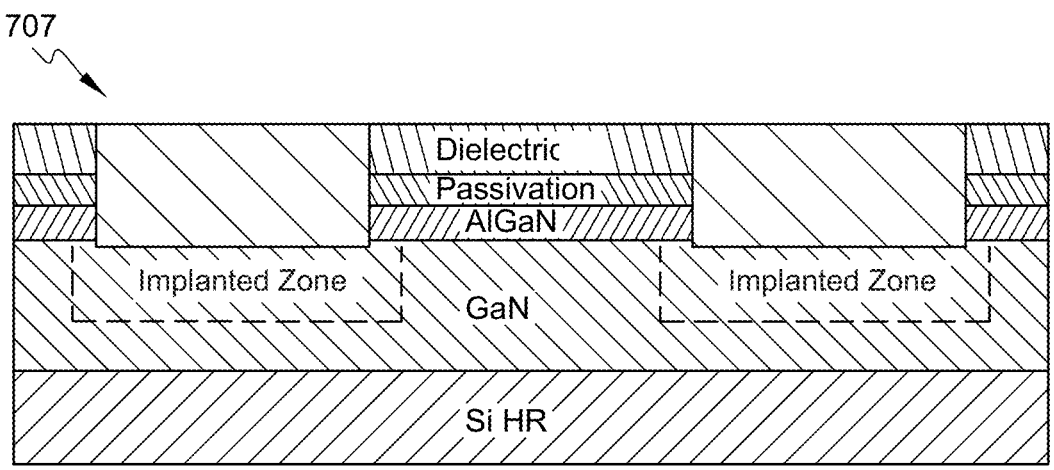

Step 706 is also illustrated in FIG. 8g. The result of step 707 of chemical mechanical polishing of the metal layer is illustrated in FIG. 8h. According to an embodiment, step 706 comprises the deposition of a Ti/Al bimetal layer with a thickness of the Ti layer comprised between 3 nm and 20 nm and a total thickness equal to 200 nm+/−50 nm.

According to an embodiment, step 707 further comprises a sub-step 707b of annealing of the metal. At the end of step 707, a metal contact having a planarized surface is obtained.

Step 707 makes it possible to reduce the parasitic capacitance between the metal of the contact and the gate electrode and to optimise the following lithography.

The method 700 further comprises a step 708 of definition and deposition of a gate electrode.

Figure 8I:
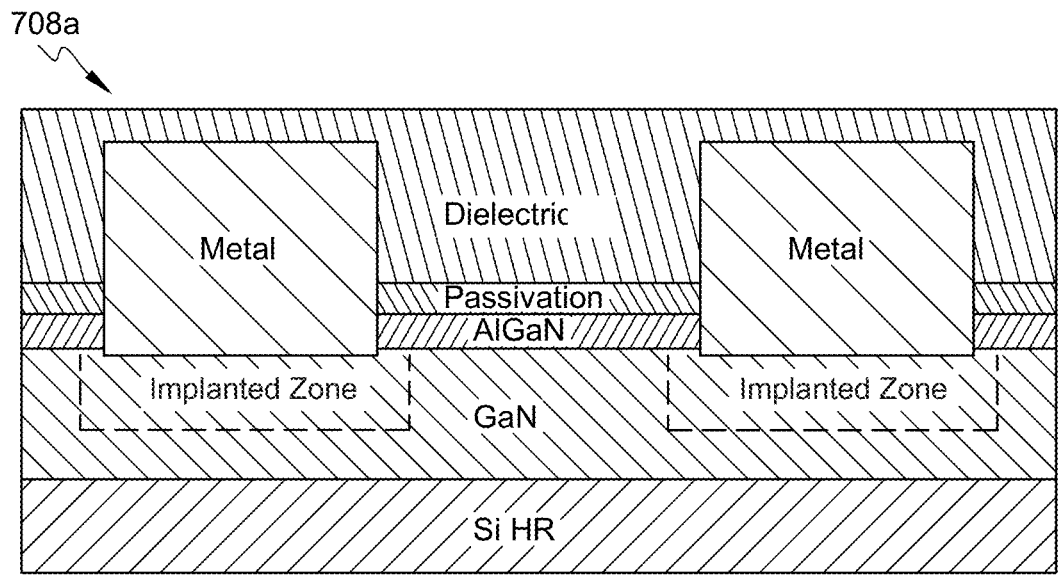
Figure 8J:
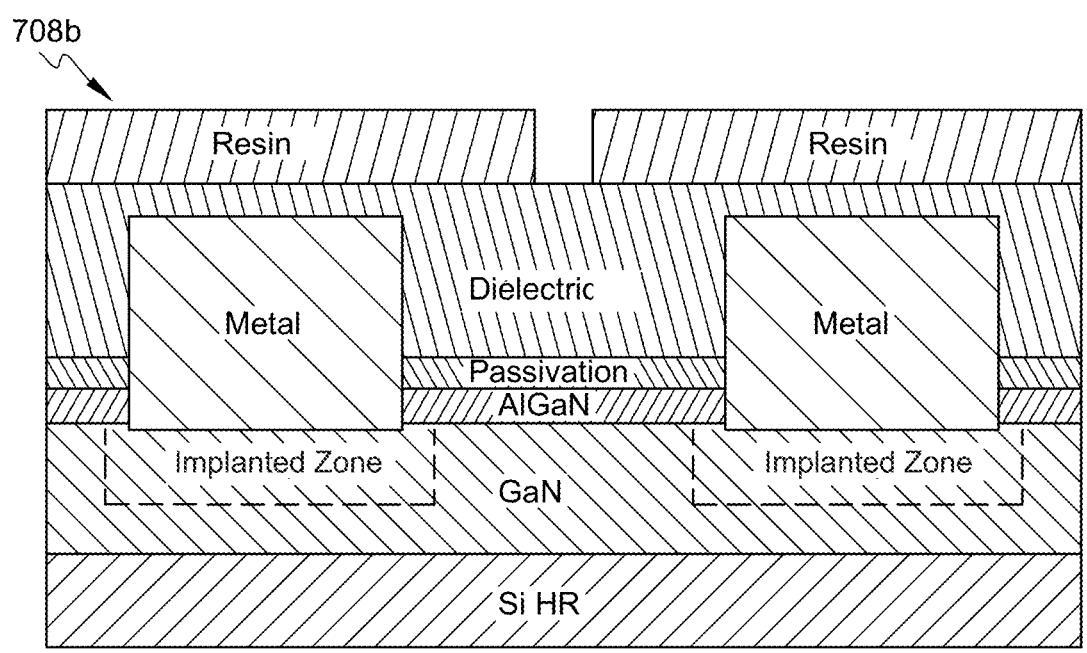
Figure 8K:
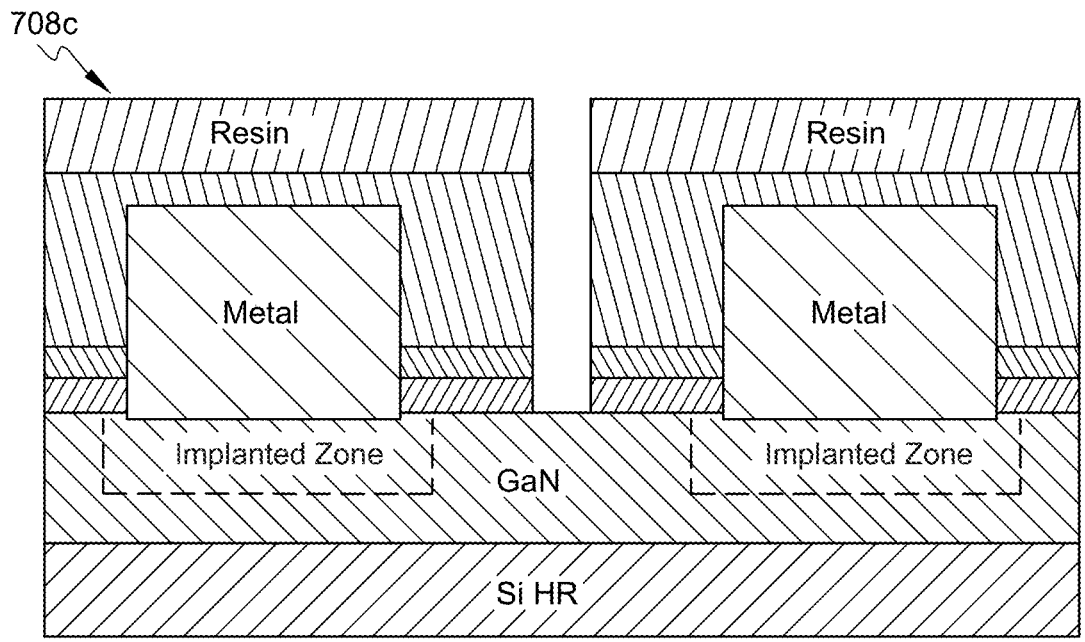
Figure 8L:
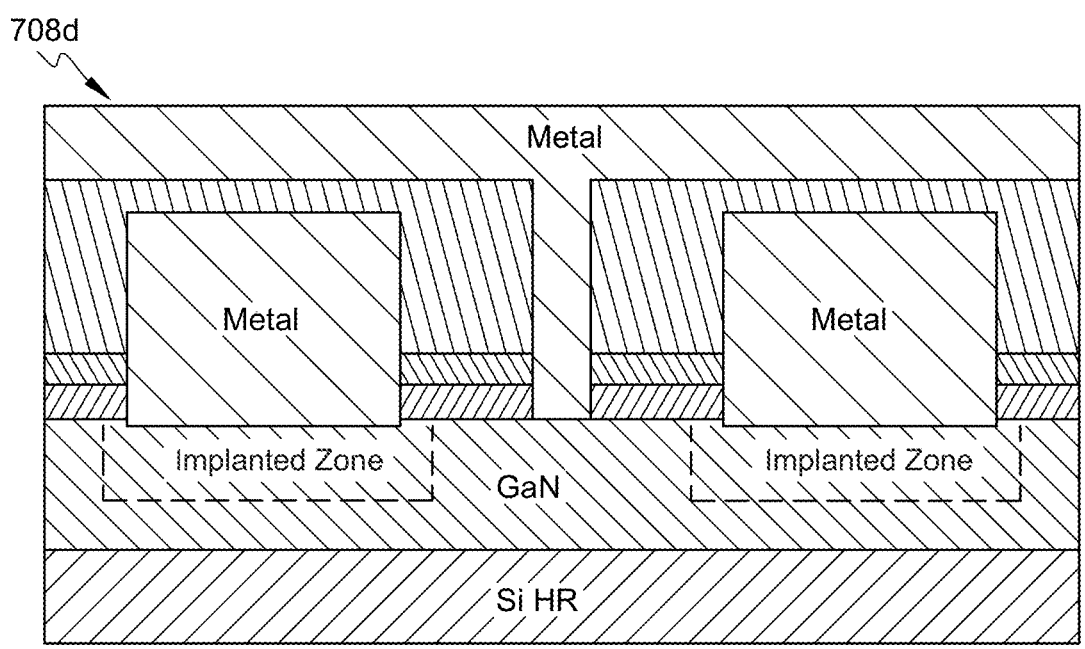
Figure 8M:
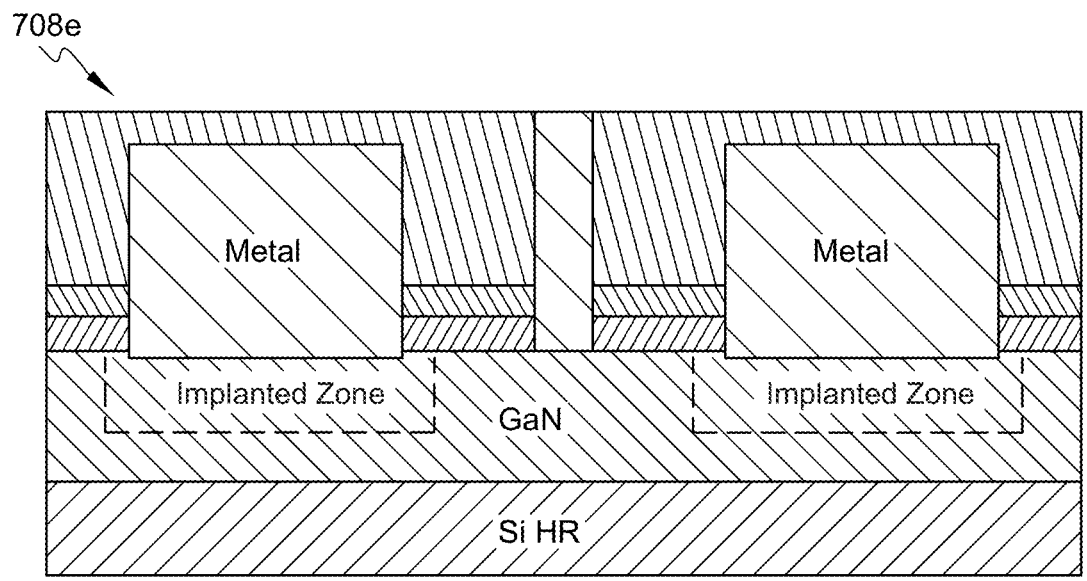
Figure 8N:
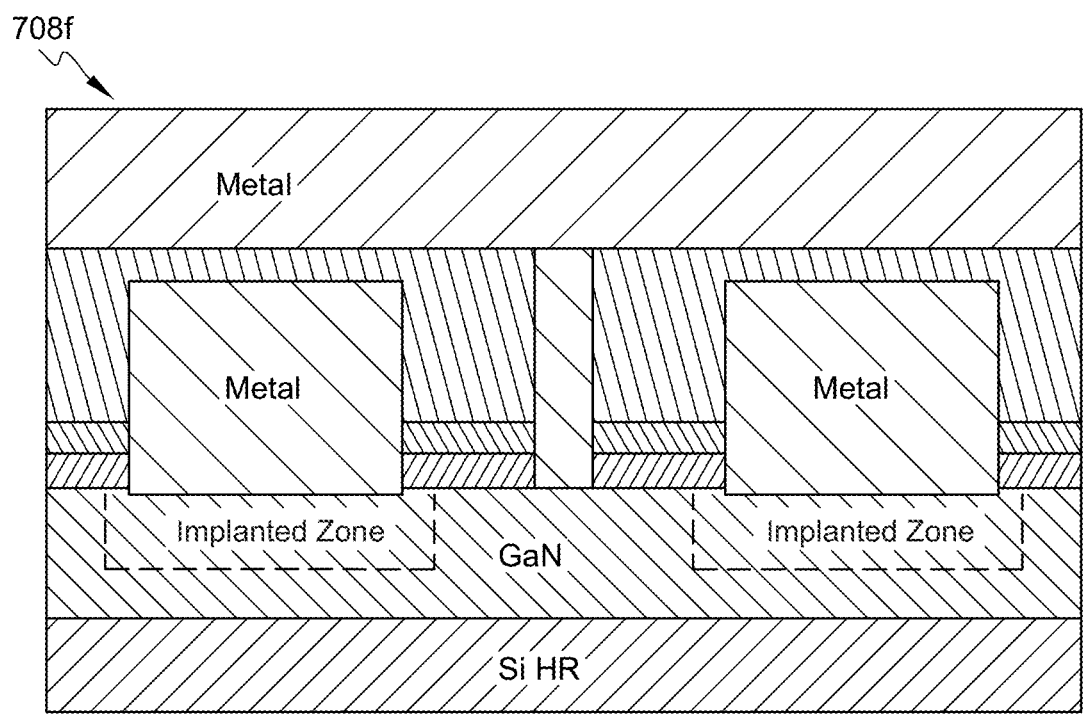
Figure 8O:
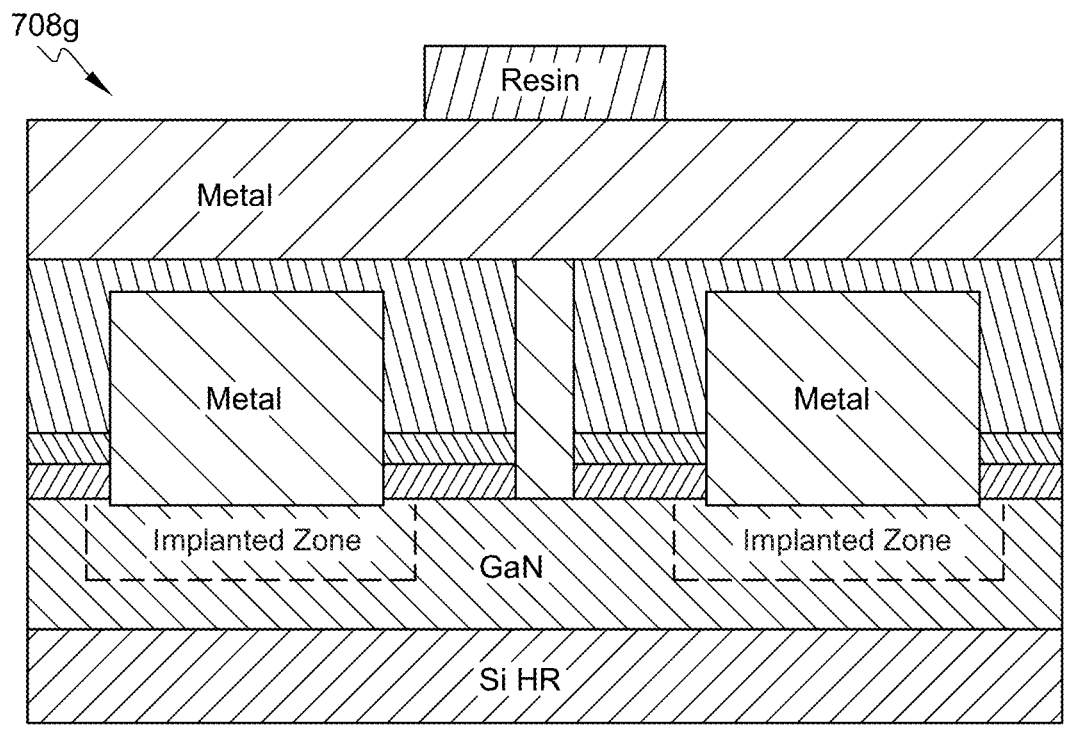
Figure 8P:
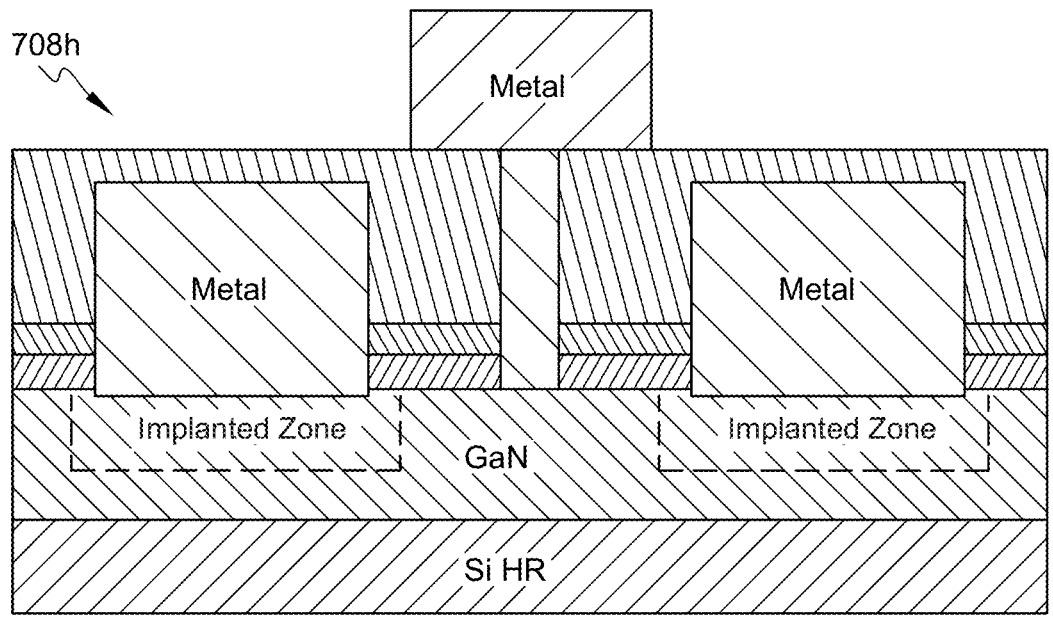

According to an embodiment, step 708 further comprises the sub-steps:
- 708a of deposition of a dielectric layer; step 708a is illustrated in FIG. 8i;
- 708b of photolithography to define the gate foot; step 708b comprising the deposition of a resin layer is illustrated in FIG. 8j;
- 708c of etching of the gate foot and removal of the resin used during the photolithography step 708b to define the gate foot; step 708c is illustrated in FIG. 8k;
- 708d of deposition of a metal used for the gate electrode; step 708d is illustrated in FIG. 8l;
- 708e of polishing of the metal used for the gate foot; step 708e is illustrated in FIG. 8m;
- 708f of deposition of a metal layer intended to form the gate head; step 708f is illustrated in FIG. 8n;
- 708g of photolithography to define the gate head; step 708g is illustrated in FIG. 8o;
- 708h of etching of excess gate head metal and removal of the resin used to define the gate head; step 708g is illustrated in FIG. 8p.

The method 700 according to an aspect of the invention is robust because it enables alignment tolerances between the ohmic contact metal, the n+ doped zone and the gate head thanks to planar technology. In addition, thanks to ion implantation technology, the method 700 according to the invention is precise, uniform and reproducible.

According to an embodiment of the method 700, it is possible to produce the drain access in addition to the source access. If the method 700 according to an aspect of the invention is used only for the source access, the drain access is produced without a step of implantation of Si. In other words, the implantation of Si is masked in correspondence with the drain contact and the drain contact is of "full recess" type.

Figure 9:
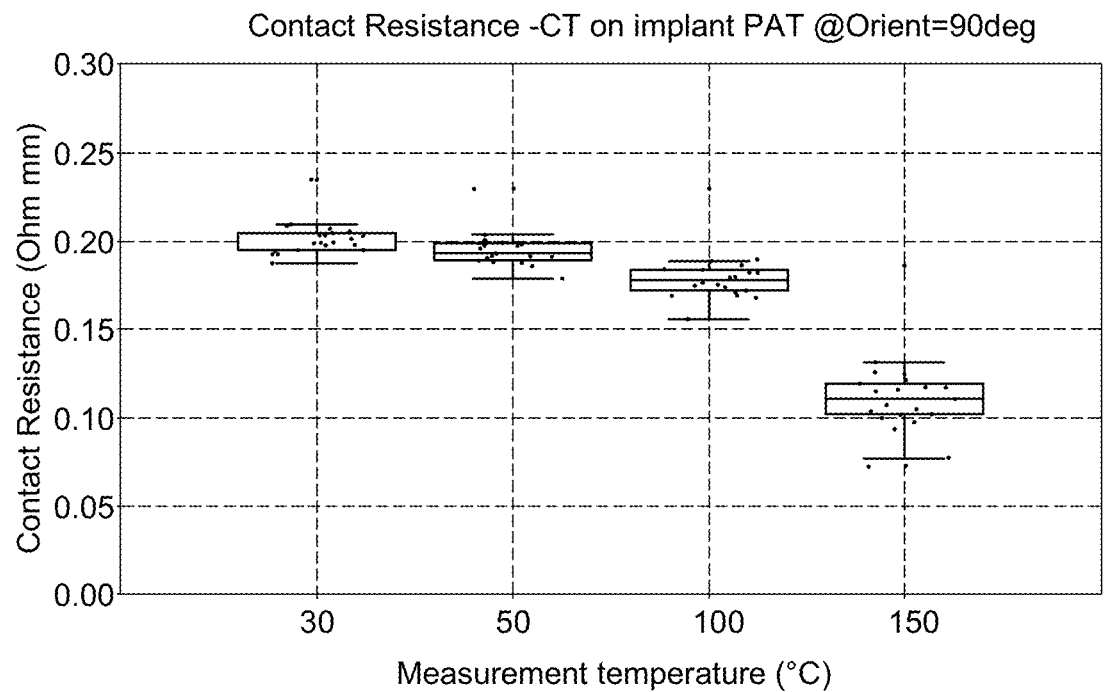
FIG. 9 illustrates the variation in the effective contact resistance of the transistor, $R_C$, as a function of the variation in operating temperature of the device according to the invention.

FIGS. 9 to 12 illustrate the variation in the different terms contributing to the access resistance of the device as a function of its operating temperature. FIG. 9 shows that the overall contact resistance Rc+Rn++Rt decreases with the operating temperature. It goes from 0.2 ohm·mm to 0.11 ohm·mm between 30° C. and 150° C., which is very favourable for the source or drain resistance of the transistor.

Figure 10:
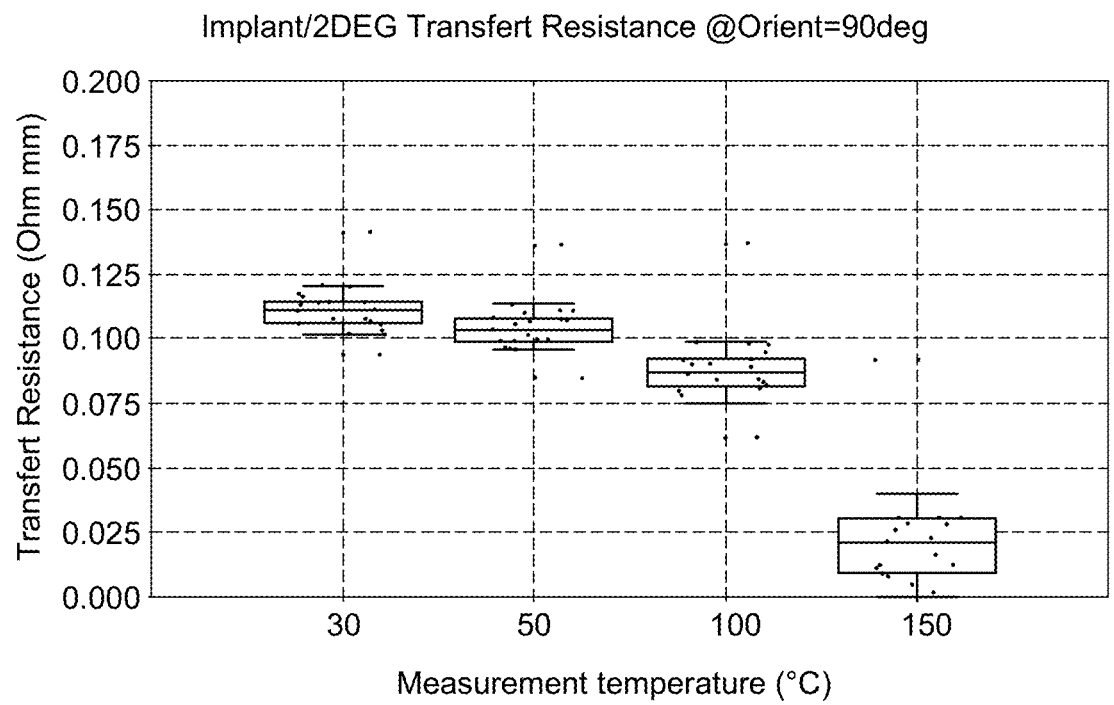
FIG. 10 illustrates the variation in the transition resistance $R_T$ as a function of the operating temperature of the device according to the invention.
Figure 11:
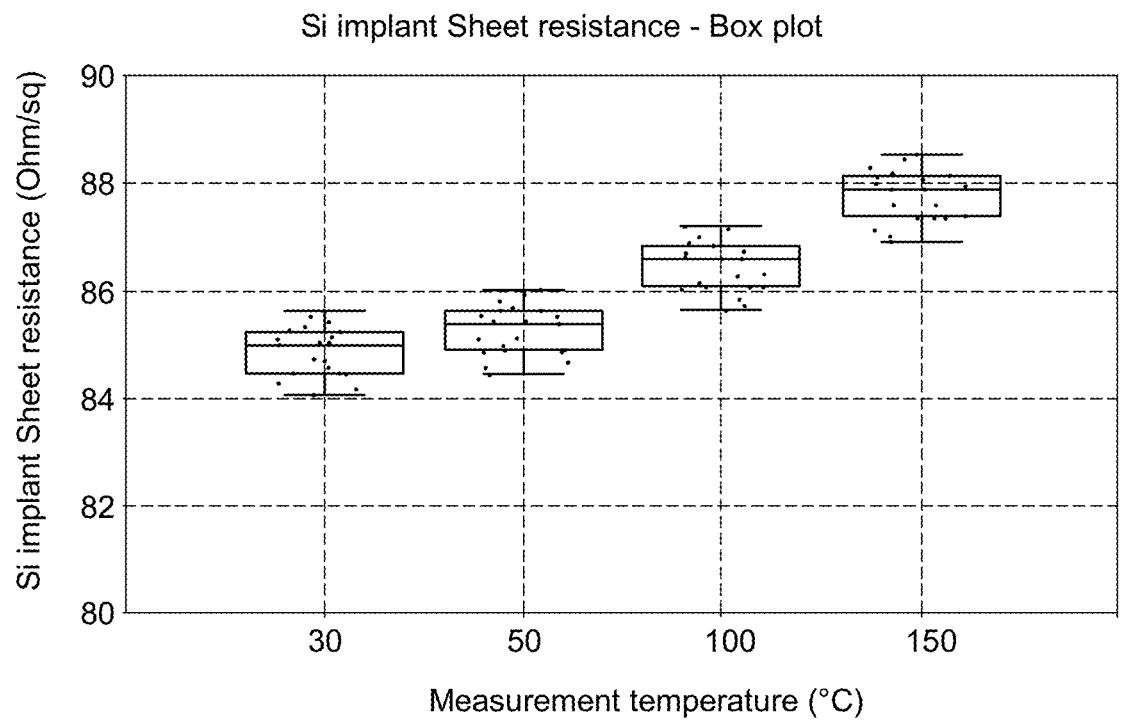
FIG. 11 illustrates the variation in the resistance of the n+ doped zone as a function of the operating temperature of the device according to the invention.
Figure 12:
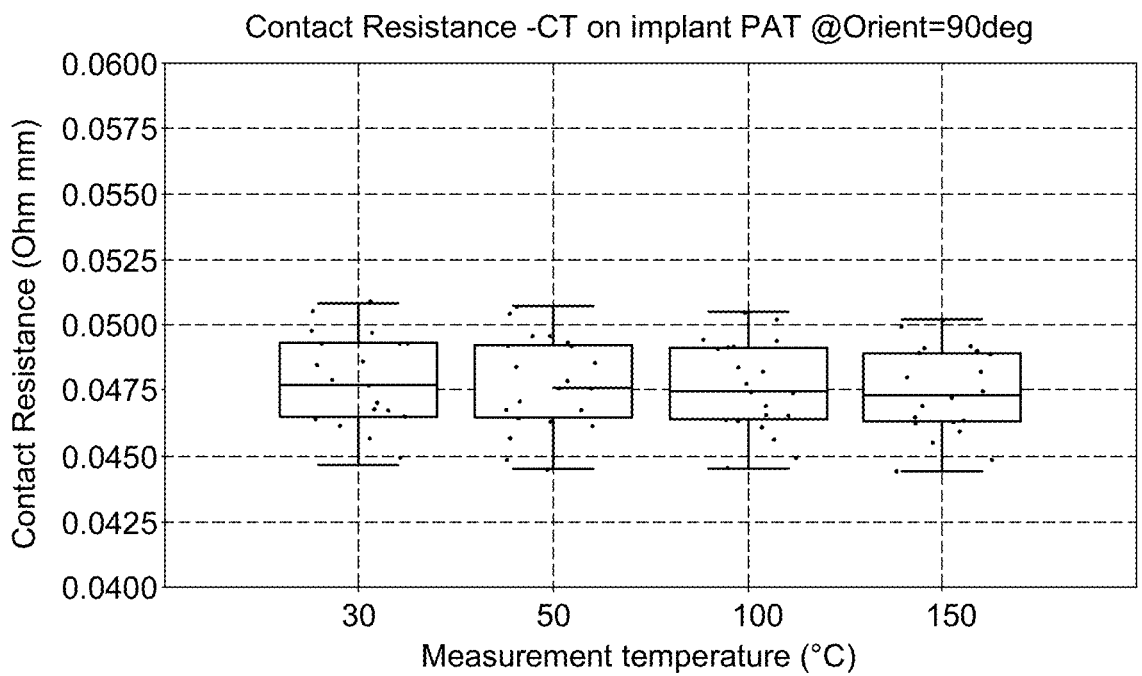
FIG. 12 illustrates the variation in the contact resistance between the n+ doped GaN and metal as a function of the operating temperature of the device according to the invention.

This behaviour is due to the significant decrease, from 0.11 to 0.024 Ohm·mm, of the transition resistance Rt with temperature, illustrated in FIG. 10, whereas the resistance of the n+ doped zone only increases by 3%, as is shown in FIG. 11 and that the metal/n+ contact resistance remains constant and equal to around 47 mOhm·mm, as shown in FIG. 12.

The source or drain resistance of the transistor according to an aspect of the invention varies very little with temperature, which makes the transistor 400 according to the invention particularly suited for high frequency power applications.

It will be appreciated that the various embodiments described previously are combinable according to any technically permissible combinations.

The invention claimed is:

1. A high electron mobility transistor comprising:
a stack of layers comprising a passivation layer and a heterojunction comprising a first semiconductor layer, a second semiconductor layer and a two-dimensional electron gas at an interface thereof, one surface of the passivation layer being in contact with the first semiconductor layer;
a source metal contact and/or a drain metal contact and a gate electrode;
a n+ doped zone situated inside the heterojunction;
the source metal contact or the drain metal contact, or both the source metal contact and the drain metal contact, being positioned at a level of a recess formed in the stack of layers, said source metal contact or said drain metal contact, or both the source metal contact and the drain metal contact, having a thickness defined by an upper face and a lower face substantially parallel to a plane of the layers, the upper face being planar, the lower face being in contact with the n+ doped zone and below the interface between the first semiconductor layer and the second semiconductor layer, said source metal contact or said drain metal contact, or both the source metal contact and the drain metal contact, further having a lateral face, the n+ doped zone extending from the lateral face of the source metal contact and/or from the lateral face of the drain metal contact to the gate electrode over a length comprised between 300 nm and 1000 nm.

2. The transistor according to claim 1, wherein the n+ doped zone is an implanted zone having a spatial doping profile of gaussian type along a direction normal to the plane of the layers.

3. The transistor according to claim 1, wherein the lower face of the source metal contact and/or the lower face of the drain metal contact is below the two-dimensional electron gas.

4. The transistor according to claim 1, wherein a distance between the gate electrode and the n+ doped zone is between 200 nm and 400 nm.

5. The transistor according to claim 1, wherein the n+ doped zone is doped with a Si or Ge type dopant with a concentration greater than or equal to $10^{20}$ cm$^{-3}$.

6. The transistor according to claim 1, wherein the first semiconductor layer comprises AlGaN and the second semiconductor layer comprises GaN.

7. The transistor according to claim 1, wherein the n+ doped zone is situated entirely inside the heterojunction.

* * * * *